(12) United States Patent
Bai et al.

(10) Patent No.: US 8,406,708 B2
(45) Date of Patent: Mar. 26, 2013

(54) JOINT PROCESS ESTIMATOR WITH VARIABLE TAP DELAY LINE FOR USE IN POWER AMPLIFIER DIGITAL PREDISTORTION

(75) Inventors: Chunlong Bai, Kanata (CA); Sai Kilambi, Ottawa (CA); Brian Lehman, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 93 days.

(21) Appl. No.: 13/119,166

(22) PCT Filed: Nov. 16, 2010

(86) PCT No.: PCT/IB2010/055187
§ 371 (c)(1),
(2), (4) Date: Mar. 15, 2011

(87) PCT Pub. No.: WO2012/066380
PCT Pub. Date: May 24, 2012

(65) Prior Publication Data
US 2012/0119832 A1 May 17, 2012

(51) Int. Cl.
*H04B 1/04* (2006.01)
(52) U.S. Cl. .................. 455/114.3; 455/114.2; 455/63.1; 455/24; 455/126; 375/296
(58) Field of Classification Search ............... 455/114.3, 455/126, 114.2, 63.1, 24; 375/296
See application file for complete search history.

(56) References Cited

U.S. PATENT DOCUMENTS 6,504,425 B1 * 1/2003 Kim .................................. 330/2
7,577,211 B2 * 8/2009 Braithwaite .................. 375/296
2003/0223508 A1 * 12/2003 Ding et al. .................... 375/296
2004/0179629 A1 * 9/2004 Song et al. .................... 375/296
2009/0237158 A1  9/2009 Hehn

FOREIGN PATENT DOCUMENTS

EP  2146474 A1  1/2010

OTHER PUBLICATIONS

Ahmed, A. et al. "Power Amplifier Linearization Using Memory Polynomial Predistorter with Non-uniform Delay Taps." IEEE MTT-S International Microwave Symposium Digest, vol. 3, Jun. 6-11, 2004.
Khurram, M. U. et al. "An Extended Nonlinear Transform Domain Adaptive Filter." IEEE Signal Processing Workshop on Higher-Order Statistics, South Lake Tahoe, CA, USA, Jun. 7-9, 1993.
Li, H. et al. "Nonlinear Least Squares Lattice Algorithm for Identifying the Power Amplifier with Memory Effects." IEEE 63rd Vehicular Technology Conference, Melbourne, Australia, May 7-10, 2006.
Ren, K. et al. "Identification of Memory Polynomial Nonlinear Models for RF Power Amplifiers with a Systolic Array Based QRD-RLS Algorithm." Asia-Pacific Microwave Conference, Macau, China, Dec. 16-20, 2008.

* cited by examiner

*Primary Examiner* — Sanh Phu
(74) *Attorney, Agent, or Firm* — Coats & Bennett, P.L.L.C.

(57) ABSTRACT

Methods and circuits for pre-distorting a signal to compensate for distortion introduced by an electronic device operating on the signal. In an example method, first and second signal samples representing the input and output of the electronic device are generated. The first and second signal samples are spaced at unit-delay intervals, and each of the second signal samples corresponds in time to one of the first signal samples. Pre-distortion weights are then calculated from the first and second signal samples, the pre-distortion weights corresponding to a pre-distortion model comprising a lattice-predictor memory model structure having multiple delays and having at least one multi-unit delay interval between adjacent delays. The calculated pre-distortion weights are then applied to the input signal, using a predistorter with a structure corresponding to the lattice-predictor memory model, to produce a pre-distorted input signal for input to the electronic device.

14 Claims, 11 Drawing Sheets

JOINT PROCESS ESTIMATOR WITH VARIABLE TAP DELAY LINE FOR USE IN POWER AMPLIFIER DIGITAL PREDISTORTION

BACKGROUND

The present invention relates generally to techniques for constructing physical models of non-linear electronic devices and, more particularly, to methods and apparatus for pre-distorting a signal to compensate for distortion subsequently introduced to the signal by an electronic device.

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, digital pre-distortion is applied to the signal at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

SUMMARY

Various embodiments of the present invention are directed to techniques for pre-distorting an input signal to compensate for distortion introduced by an electronic device operating on the input signal to produce an output signal. In particular, these techniques use a non-linear model of the pre-distortion that models memory effects with a lattice-predictor memory model. Even more particularly, the lattice-predictor memory model uses one or more multiple-sampling-interval delay elements between the adjacent taps in a lattice predictor. In some embodiments, the particular delay in these one or more multi-unit delay intervals is adapted, according to the ratio of the sampling rate to the baseband bandwidth of the input signal to the predistorter. In various embodiments, this distortion model structure is applied to model the distortion transfer function of a power amplifier or its corresponding predistorter in a PA digital pre-distortion system.

The approaches described herein facilitate high-performance modeling of memory effects in an electronic device's distortion, with relatively low complexity. While described below primarily in the context of compensating for distortion caused by power amplifiers in wireless applications, the same techniques may be used in other fields for modeling and/or compensating for distortion introduced by non-linear devices.

Accordingly, embodiments of the present invention include various methods for compensating an input signal for distortion introduced by an electronic device operating on the input signal to produce an output signal. In an example method, first and second signal samples representing the input and output of the electronic device are generated. The first and second signal samples are spaced at unit-delay intervals (i.e., at the sampling interval), and each of the second signal samples corresponds in time to one of the first signal samples. Pre-distortion weights are calculated from the first and second signal samples, the pre-distortion weights corresponding to a pre-distortion model having a lattice-predictor memory model structure. The lattice-predictor memory model has multiple delays, including at least one multi-unit delay interval between adjacent delays. The calculated pre-distortion weights are then applied to the input signal, using the lattice-predictor memory model, to produce a pre-distorted input signal for input to the electronic device.

Both indirect-learning and direct-learning approaches may be used, in various embodiments. In the former approach, the second signal samples are an input to the pre-distortion model and the first signal samples are the output of the pre-distortion model. In this approach, the pre-distortion weights are directly estimated from the first and second signal samples. In the direct-learning approach, calculating the pre-distortion weights from the first and second signal samples is a two-step process. First, device distortion parameters for a device distortion model are estimated, from the first and second signal samples. In this case, the first signal samples are the input to the device distortion model and the second signal samples are the output of the device distortion model, and wherein the device distortion model reflects distortion introduced by the non-linear electronic device. Next, the pre-distortion weights are calculated from the device distortion parameters.

In any of the methods discussed above, one or more of the delay intervals in the lattice-predictor memory model structure may be adapted. Thus, in some embodiments, at least one multi-unit delay interval of the lattice-predictor memory model structure is selected from a plurality of candidate multi-unit intervals, based on the ratio of the sampling rate of the first and second sample streams to a nominal baseband bandwidth of the input signal. In some cases, the lattice-predictor memory model structure may be designed with a uniform multi-unit delay interval between each pair of adjacent delays. In these cases, the uniform multi-unit delay interval may be selected from a plurality of candidate multi-unit intervals, in some embodiments, again based on the ratio of the sampling rate of the first and second sample streams to a nominal baseband bandwidth of the input signal.

The methods summarized above and described in more detail below may be applied in circuits of various types, including those in which the electronic device is a power amplifier in a wireless transmitter circuit. Circuits and wireless apparatus for carrying out these methods are also described herein. An example circuit comprises a sampling subcircuit configured to collect, for each of a plurality of sampling time instances, first and second signal samples representing said input and output signals, respectively, where the first and second signal samples are spaced at unit-delay intervals and where each of the second signal samples corresponds in time to one of the first signal samples. A pre-distortion modeling circuit is configured to calculate pre-distortion weights from the first and second signal samples, such that the pre-distortion weights correspond to a pre-distortion model comprising a lattice-predictor memory model structure having multiple delays and having at least one multi-unit delay interval between adjacent delays. Finally, a pre-distortion circuit configured to apply the pre-distortion weights to the input signal, to produce a pre-distorted input signal for input to the electronic device.

Of course, the present invention is not limited to the features, advantages, and contexts summarized above, and those familiar with pre-distortion circuits and techniques will recognize additional features and advantages upon reading the following detailed description and upon viewing the accompanying drawings.

DETAILED DESCRIPTION

Figure 1:
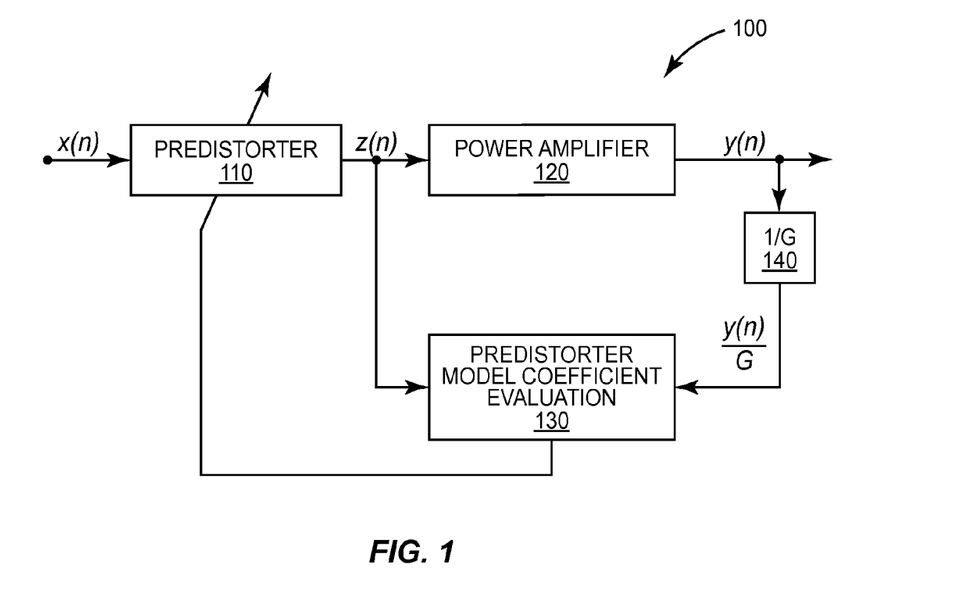
FIG. 1 illustrates an indirect-learning architecture for a pre-distortion circuit.

Referring now to the drawings, FIG. 1 illustrates a pre-distortion system 100, configured to compensate for distortion introduced to a communications signal by power amplifier 120. As noted above, a power amplifier is typically most efficient when it is operated in a non-linear range. However, the non-linear response of a power amplifier causes unwanted out-of-band emissions and reduces the spectral efficiency in a communication system. In the system 100 of FIG. 1, predistorter 110 is used to improve the power amplifier's efficiency and linearity by "pre-distorting" the power amplifier's input signal to compensate for the non-linear distortion introduced by the power amplifier 120. The cascading of predistorter 110 and power amplifier 120 improves the linearity of the output signal, even while power amplifier 120 is operated at high efficiency.

Although pre-distortion is used in the circuits and systems described herein to linearize the output of a power amplifier 120, those skilled in the art will appreciate that the techniques described herein are more generally applicable to characterizing and/or compensating for distortion caused by any type of non-linear electronic device.

As seen in the pre-distortion system 100 pictured in FIG. 1, an input signal x(n) is input to predistorter 110. Predistorter 110 pre-distorts the input signal x(n) to compensate for the distortion introduced by power amplifier 120 when the power amplifier 120 is operated in its non-linear range. The pre-distorted input signal z(n) generated by predistorter 110 is then applied to the input of power amplifier 120, which amplifies the pre-distorted input signal z(n) to produce an output signal y(n). If predistorter 110 is properly designed and configured, then the output signal y(n) contains fewer distortion products and out-of-band emissions than if power amplifier 120 were used alone.

To compensate for the distortion introduced by power amplifier 120, predistorter 110 must have a non-linear transfer function that effectively reverses the non-linear effects of the power amplifier 120. To properly configure the predistorter 110, an appropriate model for this non-linear transfer function is needed. Two different approaches to deriving this non-linear transfer function are possible. The first approach utilizes an indirect-learning architecture, as pictured in FIG. 1, and the second uses the direct-learning architecture of FIG. 2.

In both cases, the signal z(n) input to power amplifier 120 and a scaled version of the amplifier output signal y(n) are applied to a distortion modeling circuit. In the indirect-learning architecture of FIG. 1, this distortion modeling circuit comprises a predistorter model coefficient evaluation block 130. In the direct-learning architecture of FIG. 2, the distortion modeling circuit has two functional blocks: a power amplifier model coefficient evaluation block 210 and a predistorter model coefficient derivation block 220. The detailed operation of these distortion modeling circuits is described below.

Figure 2:
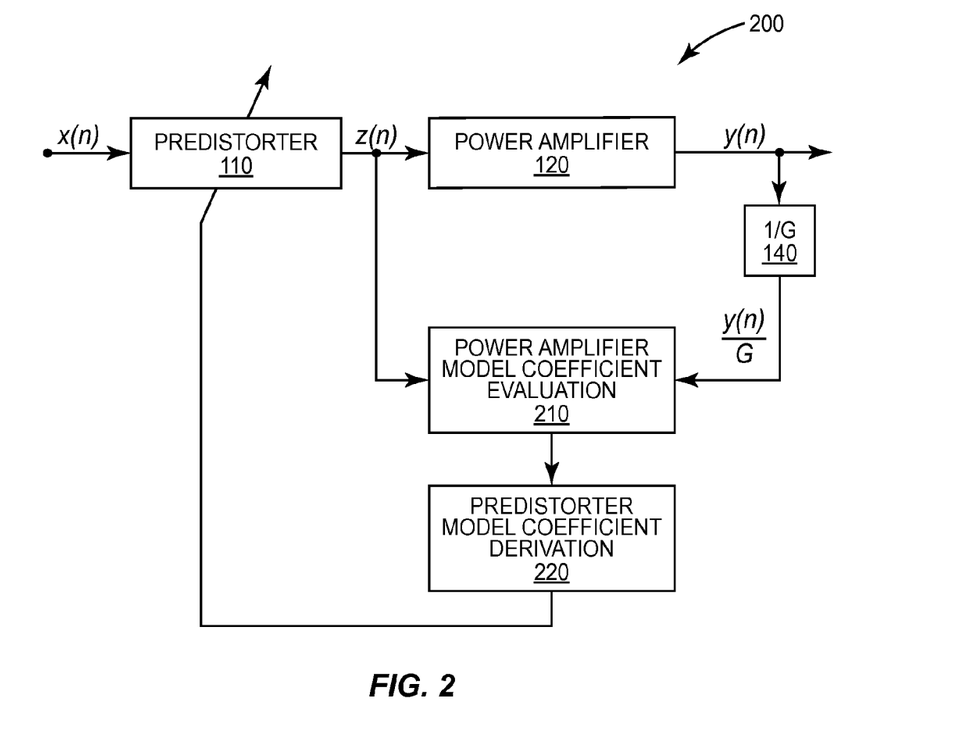
FIG. 2 illustrates a direct-learning architecture for a pre-distortion circuit.

In either case, the scaling of the power amplifier signal, illustrated as attenuator 140 in FIGS. 1 and 2, reflects the net linear gain G that is desired from the combination of predistorter 110 and power amplifier 120. Scaling the output signal y(n) by the inverse of G permits the non-linearities introduced by power amplifier 120 to be analyzed independently from its gain.

In the indirect-learning architecture of FIG. 1, a general structure for a model of predistorter 110 is taken as given, and the predistorter model's coefficients (parameters) are estimated directly from the input and outputs of power amplifier 120. Thus, predistorter modeling circuit 130 evaluates the amplifier input signal z(n) and the scaled amplifier output signal y(n)/G according to a predetermined non-linear model for the predistorter to directly determine a set of weighting coefficients to be applied by the predistorter 110. (The details of this process are described below.) With this indirect approach, a model for the power amplifier 120 is not derived. Rather, the non-linear characteristics of power amplifier 120 are learned indirectly, through the modeling of the pre-distortion necessary to counteract the distortion introduced by power amplifier 120.

In contrast, the direct-learning architecture of FIG. 2 directly characterizes the non-linear performance of power amplifier 120. First, power amplifier modeling circuit 210 evaluates the amplifier input signal z(n) and the amplifier output signal y(n)/G according to a predetermined non-linear model for the power amplifier 120. The weighting coefficients that best fit the power amplifier's non-linear characteristics to the power amplifier model in block 120 are then used by coefficient derivation circuit 220 to generate weights for configuring the predistorter 110.

In the direct-learning architecture, the distortion introduced by the power amplifier 120 is typically represented by a complicated non-linear function, which will be referred to herein as the distortion function. In the indirect-learning architecture, the response of the predistorter 100 is represented by a similar non-linear distortion function. In either case, one approach to modeling the distortion function, referred to herein as the decomposition approach, is to decompose the distortion function into a set of less complicated basis functions, each of which separately acts on the input signal. The output of the distortion function is then modeled as the weighted sum of the basis function outputs. The set of basis functions used to model the distortion function is referred to herein as the basis function set.

Figure 3:
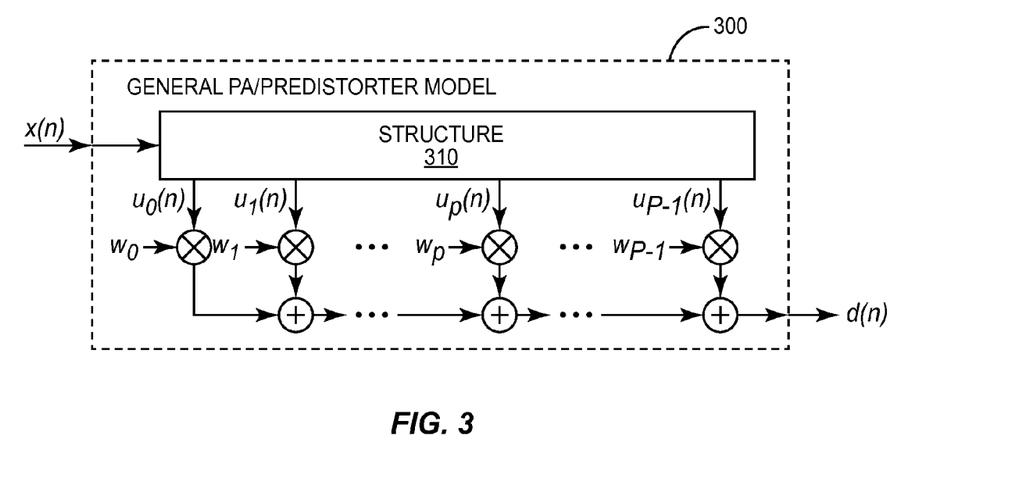
FIG. 3 illustrates a generic distortion model for modeling distortion introduced by a predistorter or power amplifier.

FIG. 3 illustrates a generalized multi-branch distortion model 300, which may represent the distortion introduced by the power amplifier 120 (e.g., as modeled by model coefficient evaluation unit 210 in the direct learning architecture of FIG. 2) or the pre-distortion transfer function of predistorter 110 (e.g., as modeled by the predistorter model coefficient evaluation unit 130 of FIG. 1). In either case, distortion model 300 comprises a structure 310 having P output taps, labeled $u_0(n)$ to $u_{P-1}(n)$. Each of these output taps represents an operation on the input signal $x(n)$—these operations may correspond to a predetermined basis function set, as will be discussed in further detail below.

Model structure 310 operates on the input signal $x(n)$ to produce data samples $\{u_0(n), u_1(n), \ldots u_{P-1}(n)\}$. Distortion model 300 then computes a weighted sum of the data samples $\{u_0(n), u_1(n), \ldots u_{P-1}(n)\}$ to obtain a distorted input signal $d(n)$. More specifically, the data samples $\{u_0(n), u_1(n), \ldots u_{P-1}(n)\}$ are multiplied by corresponding weighting coefficients $\{w_0(n), w_1(n), \ldots w_{P-1}(n)\}$, and the resulting products are added together to obtain $d(n)$.

The distortion model shown in FIG. 3 can be represented by:

$$d(n) = \sum_{p=0}^{P-1} w_p u_p(n). \quad \text{Eq. 1}$$

Equation 1 can be written as a linear equation according to:

$$d(n) = u^T(n)w, \quad \text{Eq. 2}$$

where $u(n)$ is a P×1 vector of data samples output by the structure at time n, and where w is a P×1 vector of the weighting coefficients.

For a given vector $u(n)$, $d(n)$ is the desired output of the model (e.g., the actual output of power amplifier 120, in the direct-learning architecture, or the desired output of predistorter 110, in the indirect-learning architecture). The weighting coefficients w that best fit the vector u to the desired output $d(n)$ over a period of time can be learned by fitting multiple observations of u to the corresponding desired outputs $d(n)$. Thus, for a set of observations taken at N sampling instances, the corresponding linear equations given by Equation 2 can be expressed as:

$$U \cdot W = d, \quad \text{Eq. 3}$$

where U is an N×P matrix of data signals and d is the desired output signal vector of the distortion model. The columns of the matrix U correspond to the data samples output by structure 130, while each row of the matrix corresponds to a different sampling instance. Equation 3 can be evaluated according to well known techniques (e.g., to minimize a criterion such as a least-square-error criterion) to find the weights w that best model the distortion of amplifier 120 or predistorter 110.

Figure 4:
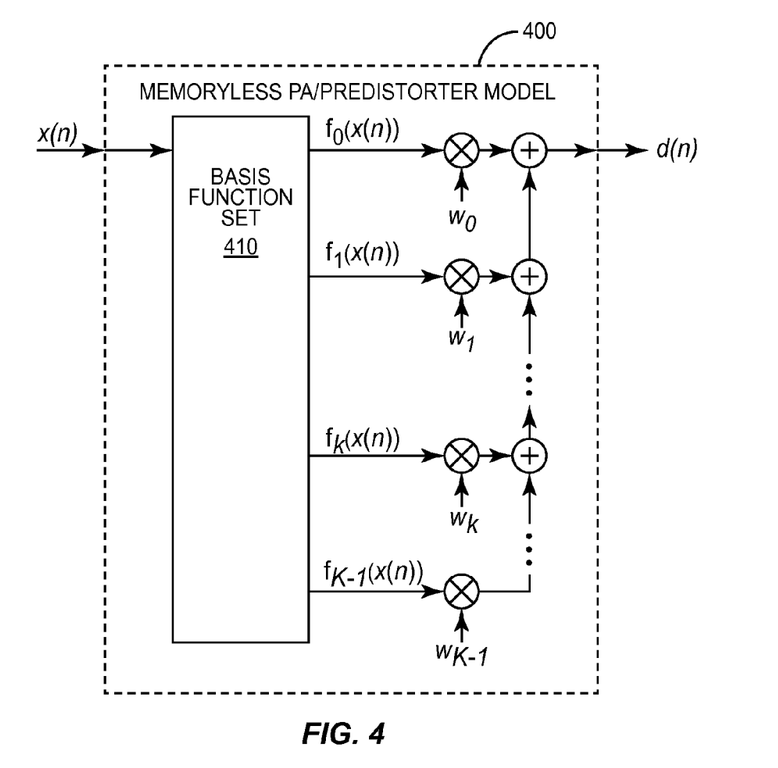
FIG. 4 illustrates a memoryless distortion model for modeling distortion introduced by a predistorter or power amplifier.

FIG. 4 illustrates a memoryless, multi-branch distortion model 400 for modeling a distortion function. In distortion model 400, the basic structure of the model is determined by a basis function set 410, comprising multiple basis functions. Each of the K branches in the model corresponds to one of these basis functions, which each operate on the input signal $x(n)$ and which are represented in FIG. 4 as $f_0(x(n))$ to $f_{K-1}(x(n))$. In this memoryless model, these functions each operate only on a present sample $x(n)$ of the input signal, and thus are "memoryless" functions. Like the functions $u(n)$ in the more general model illustrated in FIG. 3, each of the basis function output signals $\{f_0(x(n)), f_1((x(n)), \ldots f_{K-1}(x(n))\}$ are multiplied by corresponding weighting coefficients $\{w_0(n), w_1(n), \ldots w_{K-1}(n)\}$ and added together to obtain $d(n)$.

A key difference between the models of FIG. 3 and FIG. 4 is that the functions $f_0(x(n))$ to $f_{K-1}(x(n))$ in FIG. 4 are constrained to be memoryless. Thus, the model of FIG. 4 can be viewed as a special case of the model of FIG. 3, where each of the functions $f_0(x(n))$ to $f_{K-1}(x(n))$ corresponds to one of the functions $\{u_0(n), u_1(n), \ldots u_{P-1}(n)\}$ in FIG. 3. Accordingly, the weights w that best model the distortion of the amplifier 120 or the predistorter 110 can be found in a similar manner to that described above, e.g., by fitting a matrix of N observations of the outputs of basis function set 410 to a desired output signal vector d. Of course, because model 400 does not account for memory effects, the accuracy of this model relative to the actual distortion function of a given power amplifier may be limited.

Figure 5:
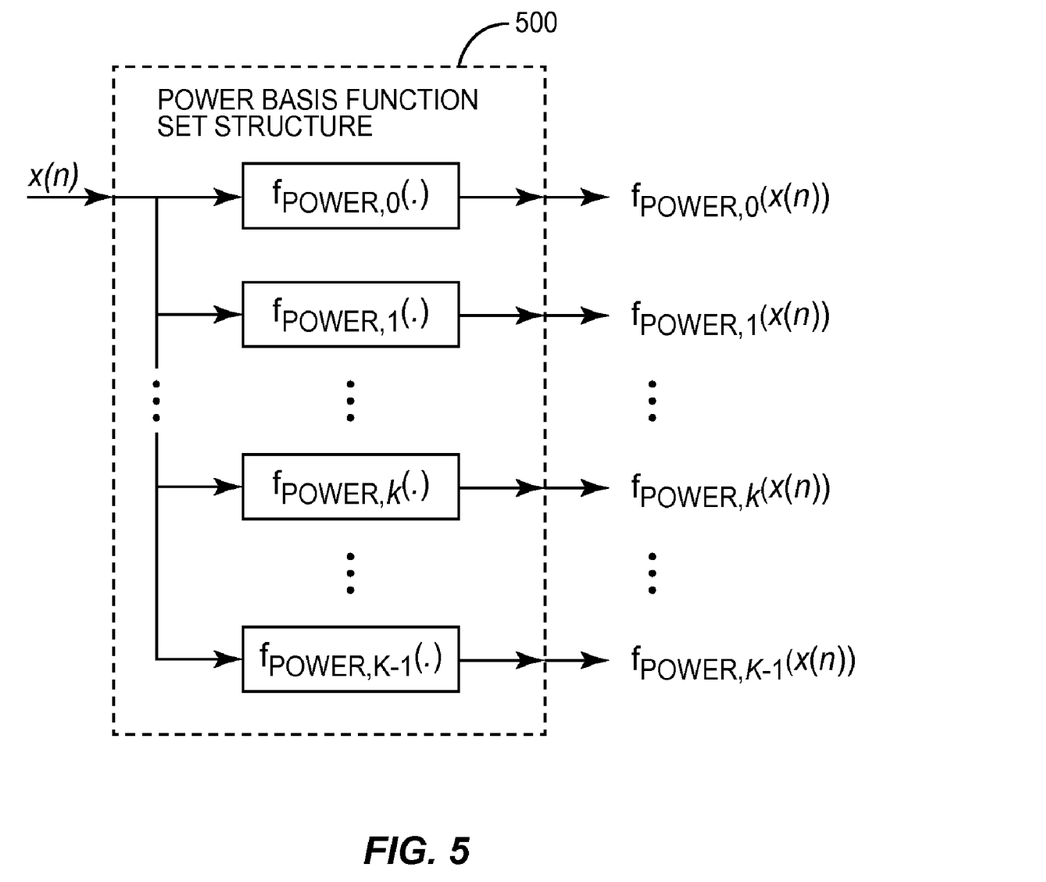
FIG. 5 illustrates a basis function set structure based on the use of power functions.

In some embodiments of this model, the basis function set 410 may consist of a set of power functions. This is illustrated in FIG. 5, where basis function set 500 comprises K outputs designated $f_{POWER,0}(x(n))$ to $f_{POWER,K-1}(x(n))$, where $f_{POWER,k}(x(n))=x(n)|x(n)|^k$. If the power basis function set 500 of FIG. 5 is used to model a distortion transfer function, then basis function set 500 corresponds to basis function set 410 of FIG. 4 and structure 310 of FIG. 3. Thus, the data samples $\{u_0(n), u_1(n), \ldots u_{P-1}(n)\}$ correspond to the outputs from the power basis functions $\{f_{POWER,0}(x(n)), f_{POWER,1}(x(n)), \ldots f_{POWER,K-1}(x(n))\}$ (where P=K). Thus, a matrix U, comprising N observations of the outputs of power basis function set 500, can be formed and fitted to a desired output signal vector d to determine the weighting coefficients w that most closely model the desired distortion function.

Figure 6:
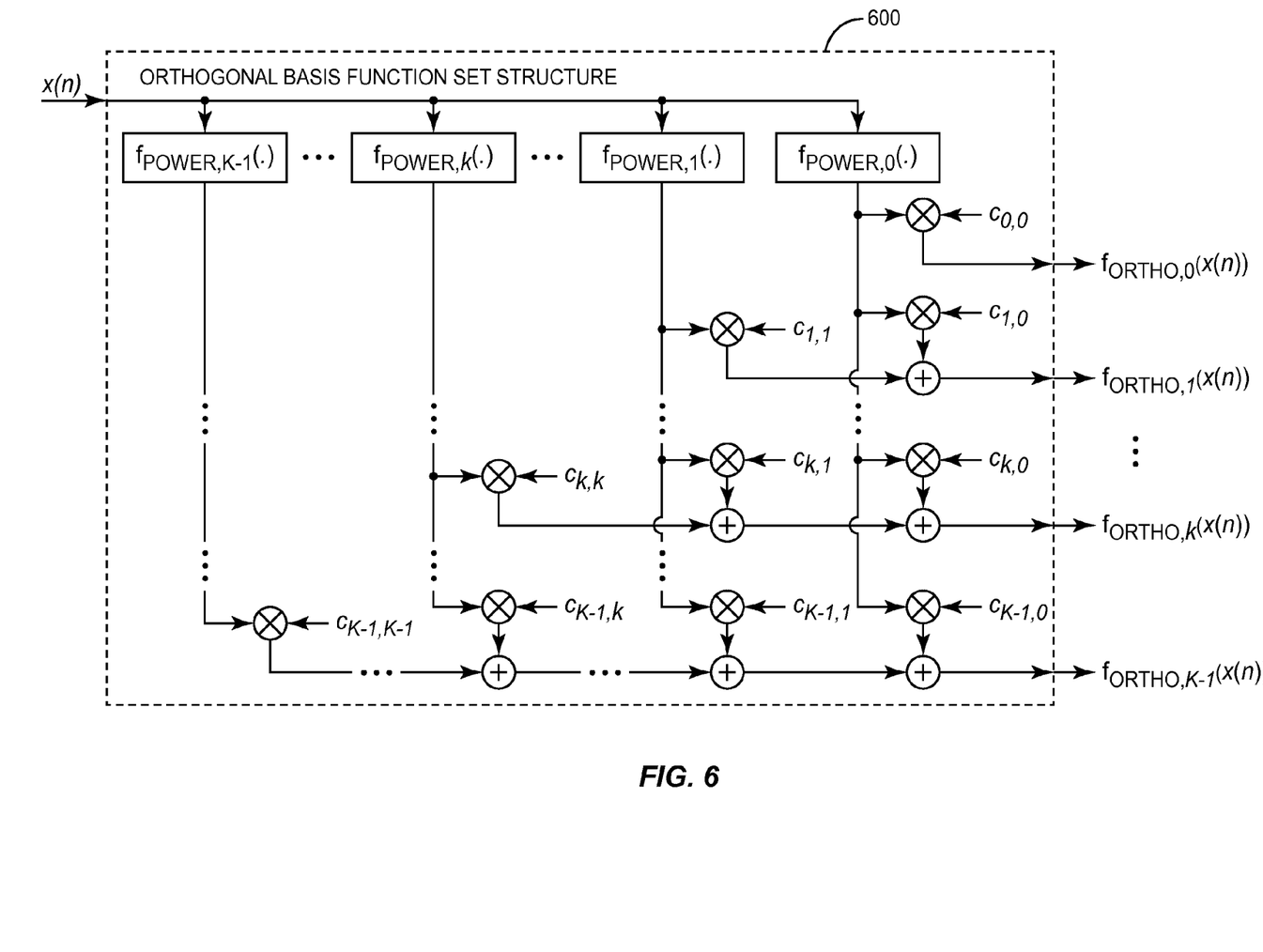
FIG. 6 illustrates an orthogonal basis function set structure for modeling distortion.

An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models. FIG. 6 illustrates the basis function set structure 600 for an orthogonal basis function set, where the outputs $f_{ORTHO,0}(x(n))$ to $f_{ORTHO,K-1}(x(n))$ correspond to the output samples $\{u_0(n), u_1(n), \ldots u_{P-1}(n)\}$ of the general model 300 of FIG. 3. In this case, each data sample $u_k(n)$ can be expressed as:

$$u_k(n) = f_{ORTHO,k}(x(n)) = \sum_{h=0}^{k} c_{k,h} f_{POWER,h}(x(n)), \quad \text{Eq. 4}$$

where the subscript 'ORTHO,k' of the tap function $f_{ORTHO,k}(x(n))$ denotes an orthogonal basis function of the k-th order. Each connection coefficient $c_{k,h}$ is the weight for the h-th order power basis function, $f_{POWER,h}(x(n))$, used in the summations of FIG. 6 to obtain the k-th order orthogonal basis function, $f_{ORTHO,k}(x(n))$. A given ensemble of coefficients $c_{k,h}$ identifies a particular orthogonal basis function set (as given by Equation 4).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
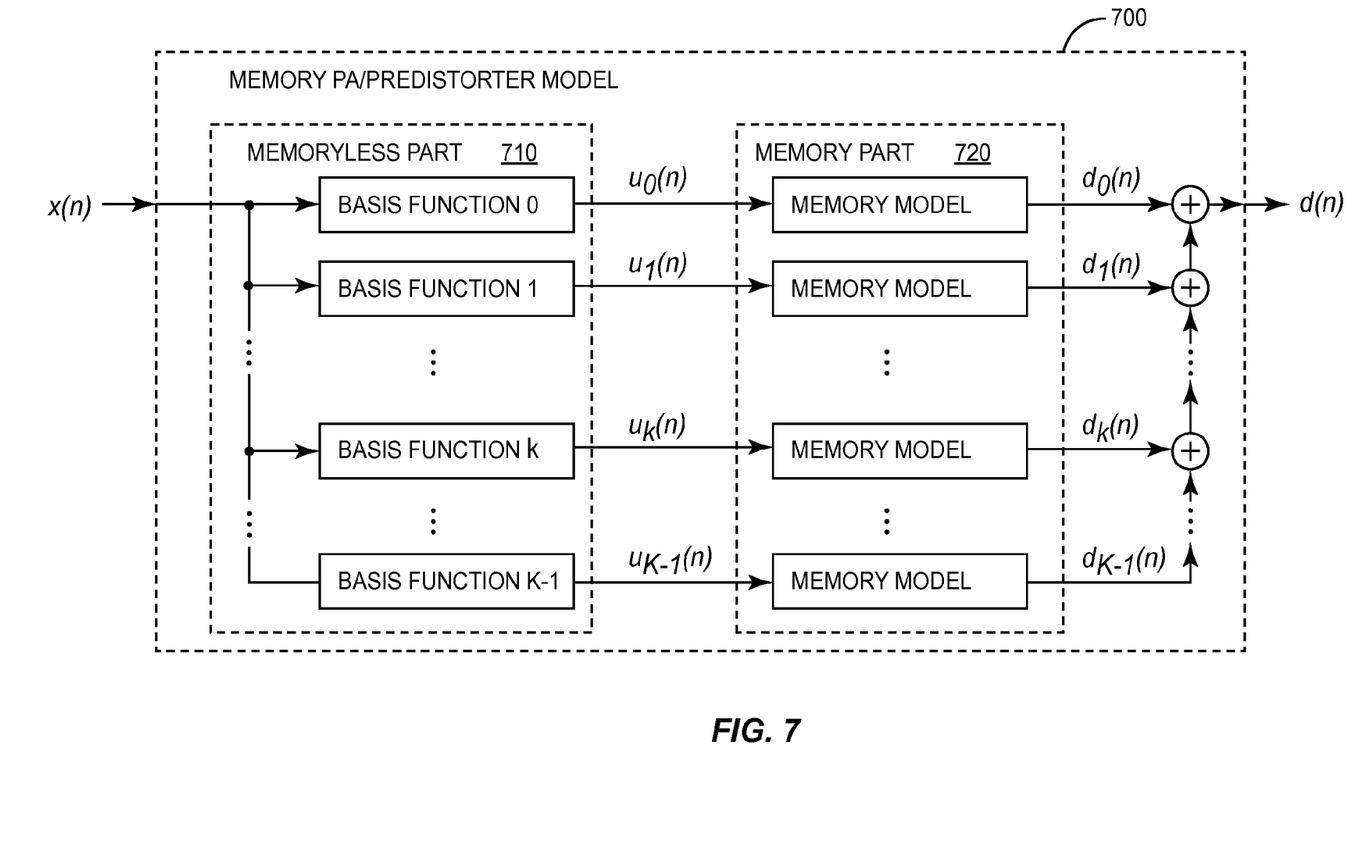
FIG. 7 illustrates a pre-distortion model that includes a memoryless part and a memory part.

Memory effects, i.e., the dependence of an output signal on prior states of the input signal as well as on the present state, can also be incorporated into a distortion function. FIG. 7 illustrates a non-linear distortion model 700 that includes memory. In FIG. 7, the model is divided into a memoryless part 710 and a memory part 720, where the memory part 720 models memory effects corresponding to each of the K basis functions. Accordingly, the basis functions in each of the K branches in memoryless part 710 supply basis function output signals to corresponding memory models in memory part 720. The output from each memory model can generally be viewed as a weighted sum of the basis function output signal and/or delayed versions of the basis function output signal. For example, if the basis function for branch k is $f_k(\cdot)$ and the input signal is $x(n)$, then the output of branch k is a weighted sum of $f_k(x(n))$, $f_k(x(n-1))$, $f_k(x(n-2))$, etc. The K outputs from the K branches are summed to form the desired distortion signal $d(n)$.

Figure 8:
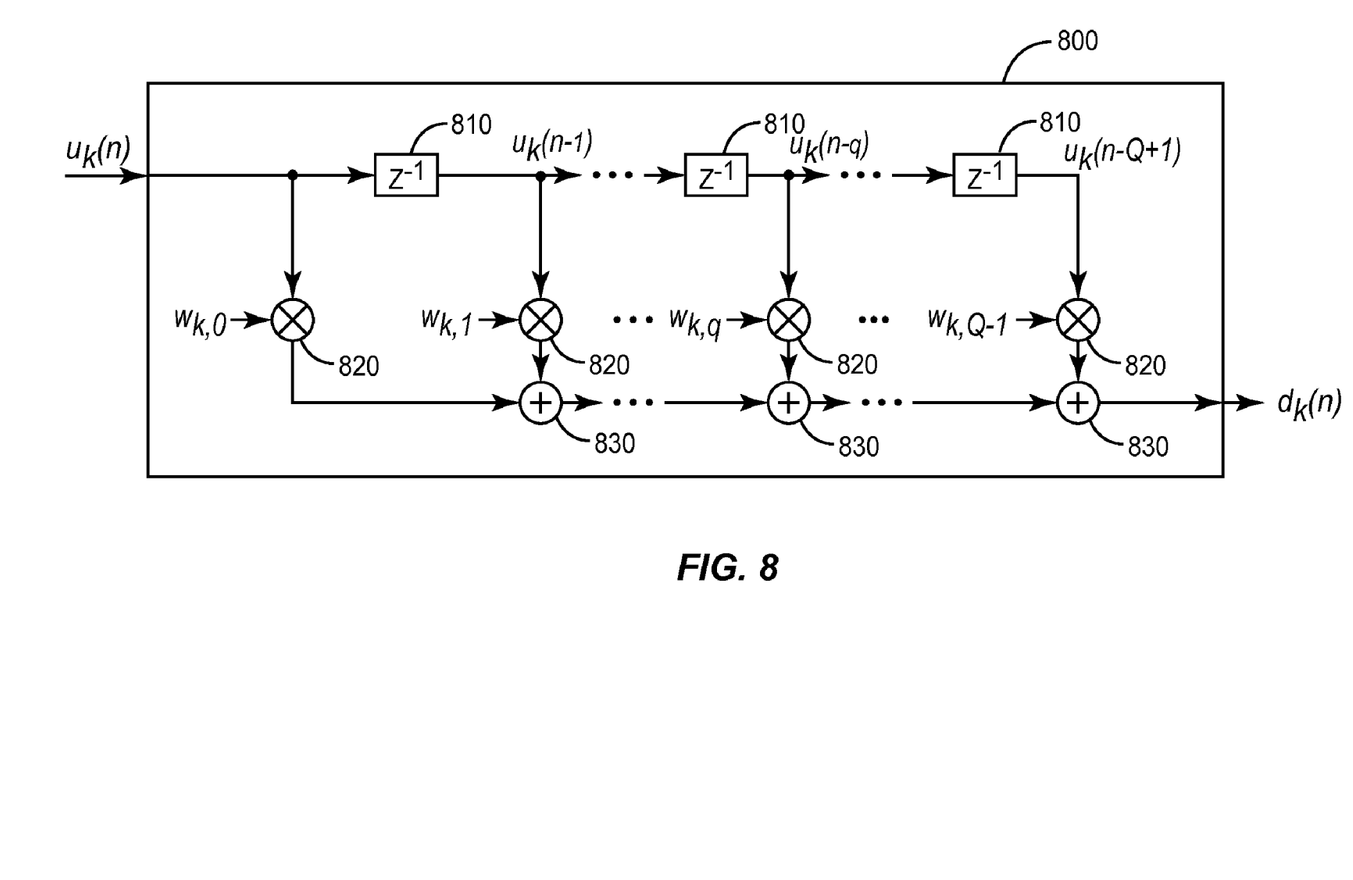
FIG. 8 illustrates a memory model based on a tapped delay line with unit delays.

The memory models in memory part 720 may have any of a variety of structures. (Typically, the general structure of the memory model for each branch is the same, although this is not necessarily the case.) One possible structure, a tapped delay line model with unit delays, is illustrated in FIG. 8. The illustrated memory model 800 corresponds to a single one of the memory models in memory part 720 of FIG. 7. Thus, a K-branch distortion model using the tapped delay line memory model 800 of FIG. 8 would include K instances of memory model 800.

In the tapped-delay-line memory model structure pictured in FIG. 8, delay elements 810 (labeled with $Z^{-1}$) represent unit delays. Thus, if the input to memory model 800 is a present sample $u_k(n)$ of the input signal, then the output of the leftmost delay element 810 is the most recent previous sample of the input signal, i.e., $u_k(n-1)$. The output of the next delay element 810 to the right is the sample prior to that one, i.e., $u_k(n-2)$. This continues through the Q-1 delay elements 810. Thus, the memory model 800 of FIG. 8 is said to have a memory depth of Q.

Each of the Q "taps" in memory model 800 (i.e., the data samples $u_k(n)$ to $u_k(n-Q+1)$ are multiplied by corresponding weights $w_{k,0}$ to $w_{k,Q-1}$, with multipliers 820. The resulting products are summed together, with adders 830, to form a branch output signal $d_k(n)$. (As can be seen in FIG. 7, the branch output signals $d_k(n)$ are summed to form the desired distortion signal $d(n)$.) The structure depicted in FIG. 8 can be represented by the following equation:

$$d_k(n) = \sum_{q=0}^{Q-1} w_{k,q} u_k(n-q). \quad \text{Eq. 5}$$

In the tapped-delay-line memory model of FIG. 8, a distinct memory function can be applied to each basis function output signal $u_k$. By configuring the weights $w_{k,q}$, any arbitrary weighted sum of the basis function output signal $u_k$ and earlier samples of the basis function output signal can be formed, up to the memory depth of Q. This allows a great deal of flexibility in modeling the memory effects of an electronic device. Q is typically chosen to ensure that that the time interval covered by Q consecutive samples is sufficient to span the most significant memory effects of the modeled distortion transfer function.

Figure 9:
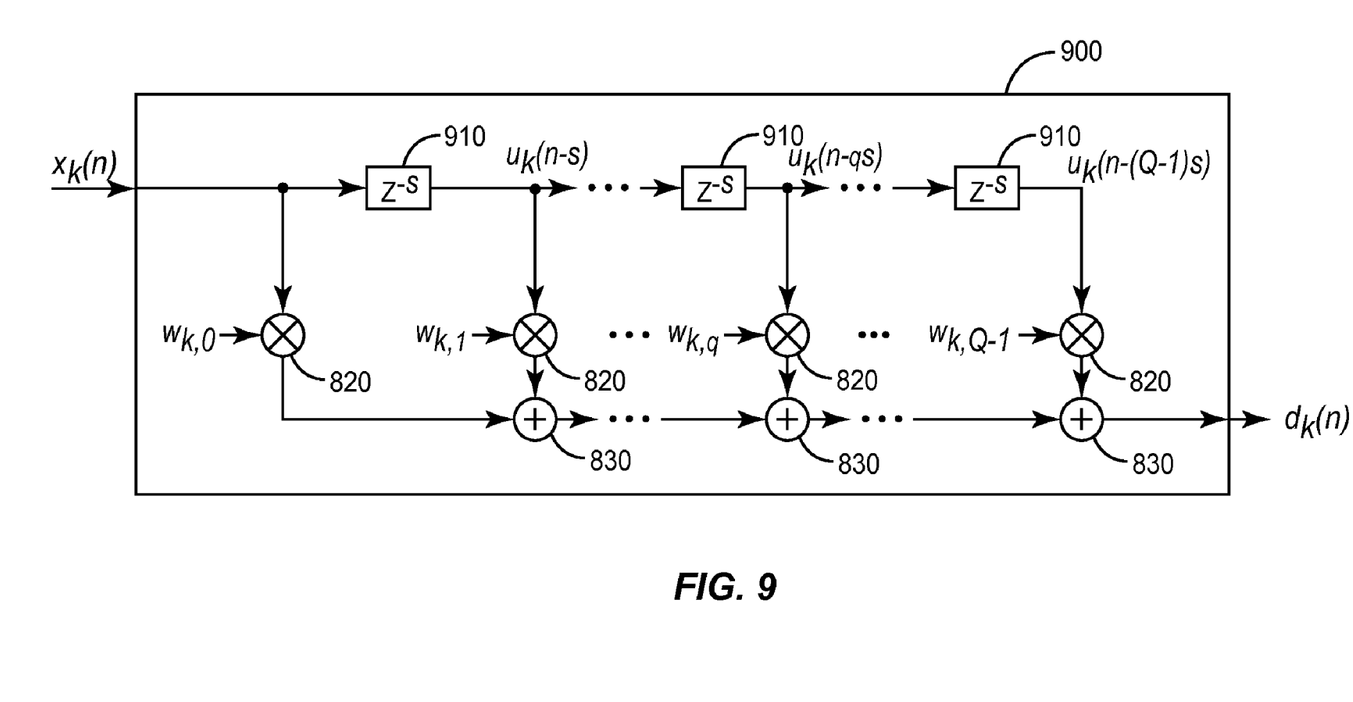
FIG. 9 illustrates a memory model based on a tapped delay line with non-unit delays.

Another memory model structure is pictured in FIG. 9. Memory model 900 has a tapped-delay-line structure similar to memory model 800. However, instead of the unit-delay elements 810 pictured in FIG. 8, memory model 900 includes several non-unit delay elements 910. These non-unit delay elements 930 are labeled $Z^{-s}$, indicating that each non-unit delay element delays its input signal by s sampling intervals, where s>1. (If s=1, then memory model 900 would be identical to memory model 800.) The structure depicted in FIG. 9 can be represented by the following equation:

$$d_k(n) = \sum_{q=0}^{Q-1} w_{k,q} u_k(n-qs). \quad \text{Eq. 6}$$

This structure allows longer memory effects to be modeled, compared to a unit-delay tapped-delay line structure having the same number of taps. However, the resulting model will have less resolution in the time domain.

Figure 10:
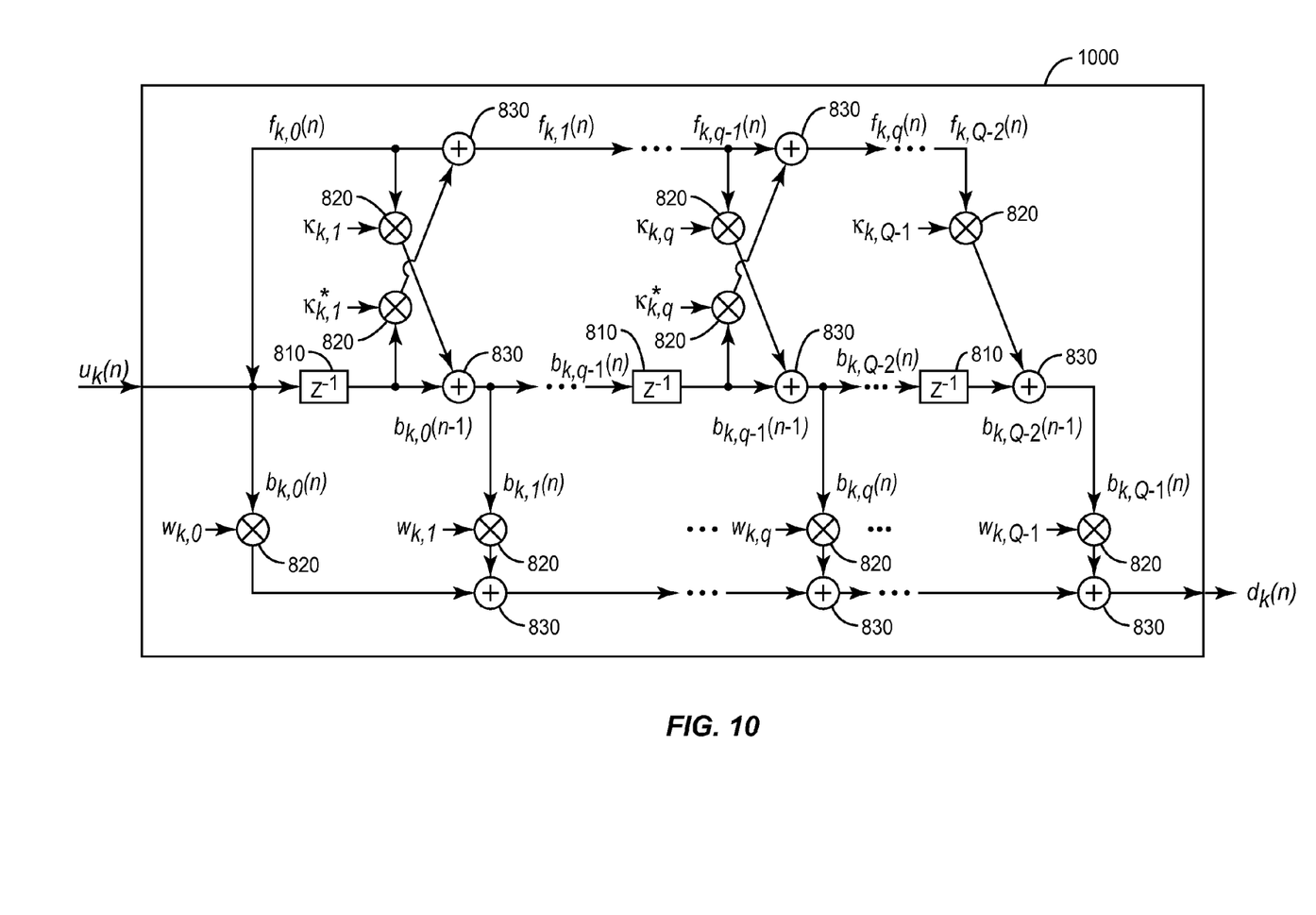
FIG. 10 illustrates a memory model based on a predictive lattice with unit delays.

Still another memory model structure is pictured in FIG. 10, which illustrates a lattice predictor memory model 1000. In lattice predictor memory model 1000, $f_{k,q}(n)$ and $b_{k,q}(n)$ are the q-th order forward and backward prediction errors, respectively, at time n. $\kappa_{k,q}$ is the q-th order reflection coefficient, and the superscript '*' denotes the conjugate transpose operation. It should be noted that in the predictive lattice memory model structure, the backward prediction error of a given order is delayed by one time unit, through unit-delay elements 810, before being used to evaluate the backward prediction error of the next order. The structure depicted in FIG. 10 can be represented by the following algorithm:

1. q=0 (initialization):

$$f_{k,0}(n) = b_{k,0}(n) = u_k(n). \quad \text{Eq. 7}$$

2. q=1, ..., Q-2 (first stage to the second-to-last stage):

$$f_{k,q}(n) = f_{k,q-1}(n) + \kappa_{k,q}^* b_{k,q-1}(n-1) \quad \text{Eq. 8}$$

$$b_{k,q}(n) = \kappa_{k,q} f_{k,q-1}(n) + b_{k,q-1}(n-1) \quad \text{Eq. 9}$$

3. q=Q-1 (the last stage; $f_{k,Q-1}(n)$ does not need to be computed):

$$b_{k,Q-1}(n) = \kappa_{k,Q-1} f_{k,Q-2}(n) + b_{k,Q-2}(n-1). \quad \text{Eq. 10}$$

An estimate $\hat{\kappa}_{k,q}$ of the q-th order reflection coefficient can be evaluated based on a typical set of data of length N using the Burg estimate as:

$$\hat{\kappa}_{k,q} = \frac{2 \sum_{n=m+1}^{N} b_{k,q-1}(n-1) f_{k,q-1}^*(n)}{\sum_{n=m+1}^{N} [|f_{k,q-1}(n)|^2 + |b_{k,q-1}(n-1)|^2]}. \quad \text{Eq. 11}$$

Note that in Equation 11, the start value of both summations are set to n=m+1 to exclude zero terms, based on the assumption that $u_k(n)=0$ for n<0.

Each of the distortion models in FIGS. 3-7 includes a set of taps, or data samples, that are weighted and summed to form the "desired" distortion signal d(n), as follows:

$$u^T(n) \underset{1 \times P}{\cdot} \underset{P \times 1}{w} = d(n).$$ Eq. 12

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of x(n−1), x(n−2), etc. Note that in Equation 12 and as generally used herein, $(\cdot)^T$ denotes a transpose, $(\cdot)^H$ denotes a conjugate transpose, P is the number of coefficients in the model, the P×1 vector u(n) denotes all of the data samples in the model at a given time index n, the P×1 vector w denotes all the coefficients in the distortion model, and d(n) is the desired output of the model for time instance n.

For any given time index n, both u(n) and d(n) are known, and Equation 12 is a linear equation of w. As noted earlier, for observations obtained on N time indices, the corresponding linear equations expressed in Equation 12 can be compactly expressed as:

$$\underset{N \times P}{U} \cdot \underset{P \times 1}{w} = \underset{N \times 1}{d}.$$ Eq. 13

In Equation 13, U is the input data matrix and d is the desired output vector.

In the indirect-learning architecture of FIG. 1, d(n) is the desired output of predistorter 110, which ideally has a distortion function that perfectly compensates for the distortion introduced by power amplifier 120. Thus, d(n) corresponds to z(n), the input to power amplifier 120, when the indirect-learning architecture is used. The input signal to the distortion model, denoted x(n) in FIGS. 3-7, corresponds to the scaled output of the power amplifier 120, y(n)/G. Thus, for any given model structure, samples of the output from power amplifier 120 are taken for each of N sampling instances and applied to a set of basis functions to produce a matrix U. This matrix U is fitted to the desired output vector d according to Equation 13, where d is a vector of samples of the input to power amplifier, taken at the same N sampling instances used to form the matrix U.

As discussed earlier, the distortion characteristics for the power amplifier are modeled directly in the direct-learning architecture, pictured in FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 13, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in digital predistorter of FIGS. 1 and 2 is the problem of estimating the coefficient vector w based on Equation 13 satisfying a certain criterion. In order to solve this estimation problem, inversion of the data matrix U, or $U^H U$, in some form is required. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, an important goal in the design of a distortion model for a power amplifier or a predistorter is to provide the coefficient evaluation algorithm with a data matrix $U^H U$ that has a relatively small number of columns (to reduce the computational complexity of the matrix operations), that has a condition number as close to 1 as possible (high numerical stability), and that at the same time also models the physical behavior of the power amplifier or predistorter as exactly as possible, given a particular optimization criteria. One major problem associated with adding memory effects to conventional distortion models is the extra instability added to the coefficient evaluation process due to the introduction of the memory model terms in the model. This problem exists for both the direct and indirect learning architectures.

This added instability is reflected in a significant increase, sometimes as much as by a factor of $10^6$, of the condition number of the data matrix that has to be inverted in the parameter evaluation process. This problem can be quite serious in an adaptive digital pre-distortion system with memory, as the parameters in such a system have to be adapted "on the fly" to track the distortion characteristics of the power amplifier over time.

A fundamental source of this added instability is the high correlation among the data samples used in the coefficient evaluations. This is a result of at least two aspects of the digital predistorter. First, successive input data samples to the predistorter exhibit high correlation with one another due to the significantly oversampled nature of the input signal to the predistorter. This high correlation is a result of the high ratio, at least on the order of 3-5, of the sampling rate to the baseband bandwidth of the input signal. This high oversampling ratio is due, in turn, to the fact that the predistorter is intended, by design, to distort the input signal. This necessarily causes bandwidth expansion. As a result, the signals processed in the predistorter system must be sampled at a rate significantly higher than that necessary to capture the information in the original, undistorted signal.

Figure 11:
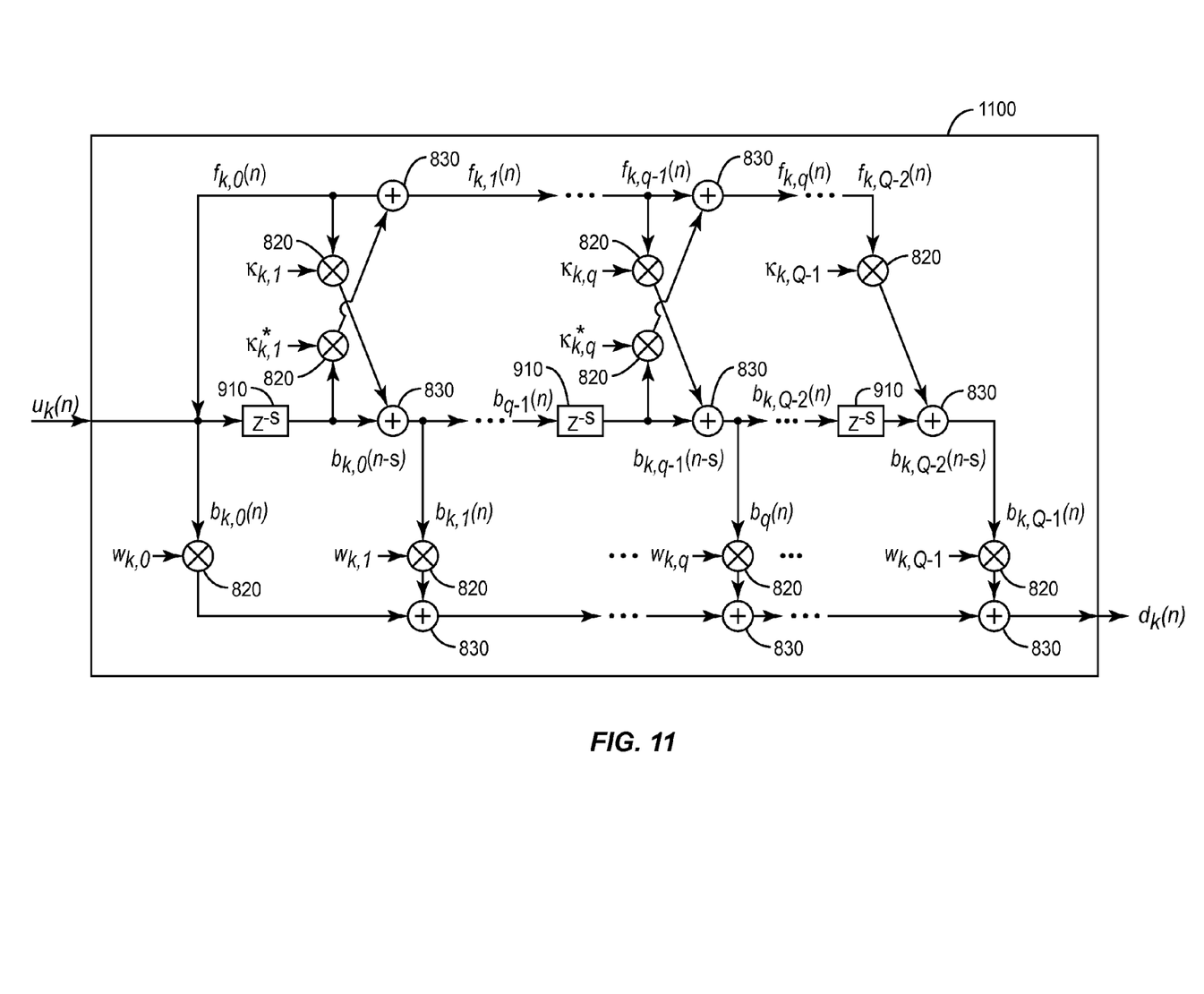
FIG. 11 illustrates a memory model based on a predictive lattice with non-unit delays.

Second, given a tapped delay line structure for the memory model, consecutive input data samples are directly used to create the matrix U that is used for coefficient evaluations. As a result, the data samples used in the coefficient evaluations exhibit high correlation FIG. 11 illustrates a lattice predictor memory model 1100 that addresses some of these problems. Lattice predictor memory model 1100 is similar to the model 1000 pictured in FIG. 10, but has non-unit delay elements 910, instead of unit-delay elements. Thus each of the delay elements 910, labeled $Z^{-s}$, delays its input signal by s sampling intervals, where s>1.

The structure depicted in FIG. 11 can be represented by the following algorithm:

1. q=0 (initialization):

$$f_{k,0}(n)=b_{k,0}(n)=u_k(n)$$ Eq. 14

2. q=1, ..., Q−2 (first stage to the second-to-last stage):

$$f_{k,q}(n)=f_{k,q-1}(n)+\kappa_{k,q}^* b_{k,q-1}(n-s)$$ Eq. 15

$$b_{k,q}(n)=\kappa_{k,q} f_{k,q-1}(n)+b_{k,q-1}(n-s)$$ Eq. 16

3. q=Q−1 (the last stage; $f_{k,Q-1}(n)$ does not need to be computed):

$$b_{k,Q-1}(n) = \kappa_{k,Q-1} f_{k,Q-2}(n) + b_{k,Q-2}(n-s).$$  Eq. 17

An estimate $\hat{\kappa}_{k,q}$ of the q-th order reflection coefficient can be evaluated based on a typical set of data of length N as:

$$\hat{\kappa}_{k,q} = \frac{2 \sum_{n=m+1}^{N} b_{k,q-1}(n-s) f_{k,q-1}^*(n)}{\sum_{n=m+1}^{N} [|f_{k,q-1}(n)|^2 + |b_{k,q-1}(n-s)|^2]}.$$  Eq. 18

Note that in Equation 18, the start value of both summations are again set to n=m+1 to exclude the zero terms based on the assumption that $u_k(n)=0$ for n<0.

The determination of the number of delays between adjacent taps (i.e, the value of s) in the non-unit-delay lattice predictor memory model is based on the trade-off between two factors. First, an increase in the delay between taps (i.e., an increase in s) results in a reduction of the condition number in the data matrix U, due to the decreased correlation between successive data samples in the matrix. This increases the stability of the mathematical computations that are performed to derive the optimal tap weights. Of course, this improvement is subject to diminishing improvements as s becomes larger. Thus, there is a point after which the benefit in terms of condition number reduction is insignificant.

Second, as with the tapped-delay-line structure, an increase in the delay between taps results in degradation of the model's performance, as manifested in terms of normalized mean square error (NMSE) between the model output and the desired signal.

As noted above, the correlation among successive samples of the input signal to the predistorter is related to the sampling-rate-to-signal-bandwidth-ratio. In some cases, a digital predistorter system may be designed for a system that can operate with different information signal bandwidths at different times. If the sampling rate for these systems is fixed, then the ratio between the sampling rate and the information signal bandwidth varies from time to time. As a result, it is advantageous in these systems to make the delay between taps in the memory model variable, such that the delay interval (i.e., the value of s) can be adjusted in response to the input signal bandwidth.

The non-unit-delay lattice predictor memory model structure of FIG. 11 achieves high modeling performance at low complexity. This structure is not only suitable for the power amplifier distortion modeling applications discussed herein, but also could be used for other non-linear modeling applications in other technical fields.

The lattice predictor memory model with configurable non-unit delays effectively models memory effects at different levels of time resolutions. Because the model covers a longer time span than a unit-delay model having the same number of taps, the model of FIG. 11 captures memory effects having a large time resolution, i.e., a time constant comparable to the sum of the unit delays in the structure. At the same time, the model captures memory effects of a small time resolution, comparable to the delays between adjacent taps. An advantage of the lattice predictor structure over the tapped-delay-line structure is that the former orthogonalizes the samples among taps, thus removing the residual correlation. It does this without losing information, and without introducing additional instability.

Furthermore, while the memory model illustrated in FIG. 11 has uniform delays between each tap (each delay element introduces a delay of s sampling intervals), this need not be the case. In some implementations, one or more of the delays introduced by delay elements 910 in FIG. 11 may vary from the others. (For example, one memory model may have several delay elements with unit-interval delays, followed by one or more with multi-unit delays. This approach facilitates the fine-resolution modeling of short-term memory effects, with coarser modeling of longer-term effects. Other configurations of non-uniform delays are also possible. (Non-uniform delays may also be applied to the tapped-delay-line memory model of FIG. 9, which as pictured has uniform, multi-unit delay intervals.)

Figure 12:
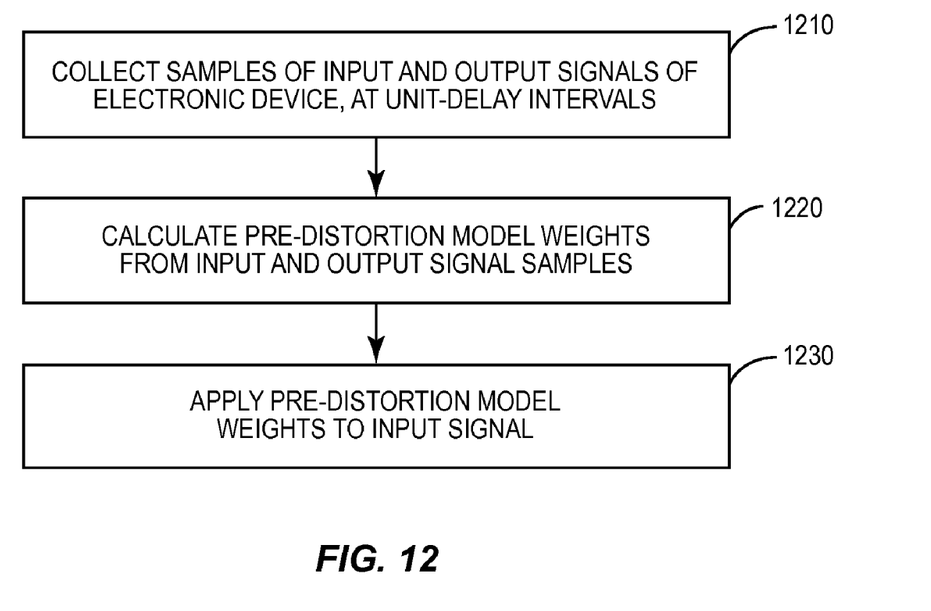
FIG. 12 is a process flow diagram illustrating an example method for compensating an input signal for distortion introduced by an electronic device.

With the above discussion of FIG. 11 and its possible variants in mind, those skilled in the art will appreciate that FIG. 12 is a process flow diagram that illustrates a general method for compensating an input signal for distortion introduced by an electronic device operating on the input signal to produce an output signal. This process may be used, for example, to compensate for distortion introduced by a power amplifier in a wireless transmitter circuit. However, the process is more generally applicable for creating non-linear distortion models to reverse the distortion introduced by an electronic device.

The illustrated process begins, as shown at block 1210, by generating, for each of a plurality of sampling time instances, first and second signal samples representing said input and output signals, respectively. The first and second signal samples are consecutive signal samples, and are therefore spaced at unit-delay intervals. Each of the second signal samples corresponds in time to one of the first signal samples. Referring back to FIGS. 1 and 2, the first and second signal samples correspond to the input z(n) and output y(n) (or scaled output y(n)/G) of the power amplifier. However, it should be appreciated that much of the processing illustrated generally in FIG. 12 may be performed at baseband frequencies. Thus, the first and second samples are likely to be digital samples of the baseband equivalents of the input and output signals z(n) and y(n). The input samples, for instance, may comprise a baseband modulation signal created by a digital processor directly from a baseband information signal. The output samples, on the other hand, may be sampled from a down-converted version of the power amplifier output signal y(n).

In any case, the process of FIG. 12 continues, as shown at block 1220, with the calculation of pre-distortion weights from the first and second signal samples. The pre-distortion weights correspond to a pre-distortion model comprising a lattice-predictor memory model structure having multiple delays and having at least one multi-unit delay interval between adjacent delays. As discussed above, in some embodiments the lattice-predictor memory model has uniform multi-unit delay intervals, as shown in FIG. 12. In other embodiments, however, one or more of the delay intervals may differ from the others, so that the delay intervals are not uniform throughout the memory model's depth. In some embodiments, for instance, several of the delay intervals may be unit-interval delays, while one or more other delay intervals are multi-unit delays.

As shown at block 1230 of FIG. 12, the pre-distortion weights calculated from the first and second samples, using the lattice-predictor memory model, are applied to the input signal, using a predistorter with a structure corresponding to the lattice-predictor memory model, to produce a pre-distorted input signal for input to the electronic device.

As noted earlier, either a direct-learning architecture or indirect-learning architecture may be used to calculate the pre-distortion weights from the first and second signal samples. In the indirect-learning model, the characteristics of the power amplifier (or other electronic device) are not learned directly. In embodiments using the indirect-learning approach, then, the second signal samples (corresponding to the output of the power amplifier or other electronic device) are an input to the pre-distortion model and the first signal samples (corresponding to the input of the electron device) are the output of the pre-distortion model, and the pre-distortion weights are directly estimated from the first and second signal samples, using the techniques described earlier (e.g., in connection with Equation 13, above).

Figure 13:
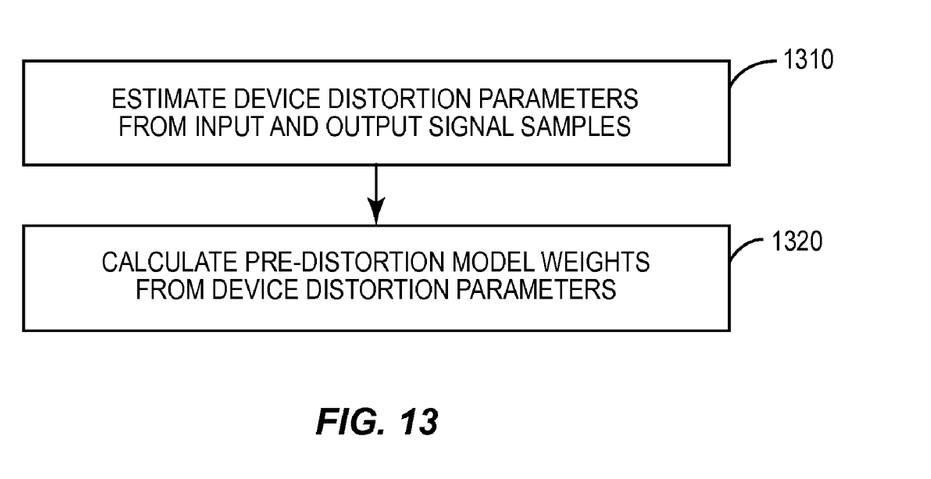
FIG. 13 is another process flow diagram, illustrating the derivation and application of pre-distortion model weights.

In the direct-learning model, by contrast, the characteristics of the electronic device itself are modeled (or "learned"). In embodiments that use the direct-learning model, the calculation of the pre-distortion weights from the first and second signal samples is a two-step process. This process is illustrated at FIG. 13. First, device distortion parameters for a device distortion model are estimated, as shown at block 1310, using the first and second signal samples and the predictive-lattice memory model. With this approach the first signal samples (corresponding to the input of the electronic device) are the input to the device distortion model and the second signal samples (corresponding to the output of the electronic device) are the output of the device distortion model. Thus, the device distortion model directly reflects distortion introduced by the non-linear electronic device. Next, the weights for device distortion model are used to calculate pre-distortion weights for the pre-distortion transfer function required to "reverse" the distortion of the electronic device.

The process for determining the weights for the device distortion model is the same as discussed earlier—N observations of the tap outputs of the lattice-predictor memory model are captured, to generate a matrix U that represents N instances of the lattice-predictor memory model's transformation of the input samples. This matrix U is fitted to the "desired" distortion signal vector d (whose elements correspond to the second signal samples), using a particular optimization criteria, to determine the weights of the device distortion model.

The processes discussed above with regard to FIGS. 12 and 13 are performed in view of a given lattice-predictor memory model structure having at least one multi-unit delay between successive taps. In some embodiments, the particular delay may be configurable, based on the current status or configuration of the circuit in which this technique is applied. For example, given a memory model with uniform delay intervals, a particular uniform multi-unit delay interval can be selected from a plurality of candidate multi-unit intervals, based on the ratio of the sampling rate of the first and second sample streams to a nominal baseband bandwidth of the input signal. This approach can be applied more generally, however, such that any one or more of the multi-unit delay intervals of the lattice-predictor memory model structure may be selected from a plurality of candidate multi-unit intervals, in some embodiments, based on the ratio of the sampling rate of the first and second sample streams to a nominal baseband bandwidth of the input signal.

Figure 14:
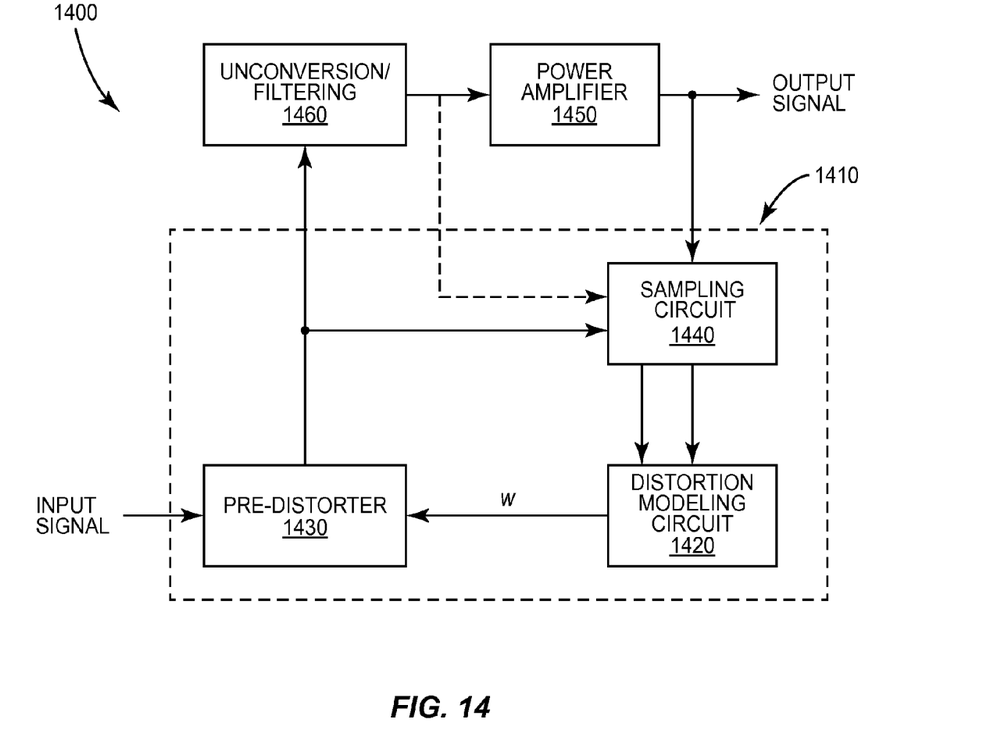
FIG. 14 is a schematic diagram of a distortion compensation circuit according to some embodiments of the present invention.

FIG. 14 is a block diagram illustrating a circuit 1400 configured to compensate an input signal for distortion introduced by an electronic device operating on the input signal to produce an output signal. More particularly, FIG. 14 illustrates a pre-distortion circuit 1410 that is configured to compensate for distortion introduced to a communications signal by power amplifier 1450. Thus, circuit 1400 may be used in a wireless transmitter circuit, for example, such as may be found in a cellular base station or a wireless mobile device.

Pre-distortion circuit 1410 includes a distortion modeling circuit 1420, a predistorter 1430, and a sampling circuit 1440. Sampling circuit 1440 (which may include a downconverter to shift the power amplifier output signal to baseband or to a lower frequency) takes samples of the output from power amplifier 1450 and provides them to the distortion modeling circuit 1420. In some embodiments, sampling circuit 1440 may also be configured to take samples of the input to power amplifier 1450. In others, however, distortion modeling circuit 1420 may instead use digital baseband samples corresponding to the input signal before it is upconverted (by upconversion/filtering circuit 1460) to radio frequencies.

Distortion modeling circuit 1420 comprises a processor circuit (consisting of, for example, one or more microprocessors, microcontrollers, digital signal processors, or the like) configured with appropriate software and/or firmware to carry out one or more of the techniques discussed above and illustrated in the process flows of FIGS. 12-13. The distortion modeling circuit 1420 could also be implemented (in whole or in part) by one or more dedicated integrated circuits, such as one or more field-programmable gate arrays (FPGAs) or application-specific integrated circuits (ASICs).

Thus, distortion sampling circuit 1440 is configured to generate, for each of a plurality of sampling time instances, first and second signal samples representing said input and output signals, respectively, where said first and second signal samples are spaced at unit-delay intervals and where each of the second signal samples corresponds in time to one of the first signal samples. Distortion modeling circuit 1420 is configured to calculate pre-distortion weights from the first and second signal samples, where the pre-distortion weights correspond to a pre-distortion model comprising a lattice-predictor memory model structure having multiple delays and having at least one multi-unit delay interval between adjacent delays. Predistorter application circuit 1430 is configured to apply the pre-distortion model weights to the input signal, according to the lattice-predictor memory model structure, to produce a pre-distorted input signal for input to the electronic device (via upconversion/filtering circuit 1460).

Pre-distortion application circuit 1430 replicates the same structure for a distortion model as was used in calculating the pre-distortion model weights. Thus, for example, predistorter circuit 1430 may operate according to the structure shown in FIG. 11. Those skilled in the art will appreciate that pre-distortion application circuit 1430 may be implemented using a microprocessor, in some embodiments, in which case the multiplication, addition, and demultiplexing operations illustrated in those figures are implemented with appropriate software. (In some of these embodiments, pre-distortion application circuit 1430 may share one or more processors with distortion modeling circuit 1420.) In other embodiments, pre-distortion modeling circuit 1430 may be implemented partly or entirely with hardware, i.e., using FPGAs, ASICs, hardware multipliers, adders, and/or demultiplexers.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method for pre-distorting an input signal to compensate for distortion introduced by an electronic device operating on the input signal to produce an output signal, the method comprising:
generating, for each of a plurality of sampling time instances, first and second signal samples representing said input and output signals, respectively, wherein said first and second signal samples are spaced at unit-delay intervals and wherein each of the second signal samples corresponds in time to one of the first signal samples;
calculating pre-distortion weights from the first and second signal samples, wherein the pre-distortion weights correspond to a pre-distortion model comprising a lattice-predictor memory model structure having multiple delays and having at least one multi-unit delay interval between adjacent delays; and
applying the pre-distortion weights to the input signal, to produce a pre-distorted input signal for input to the electronic device.

2. The method of claim 1, wherein the second signal samples are an input to the pre-distortion model and the first signal samples are the output of the pre-distortion model, and wherein calculating the pre-distortion weights from the first and second signal samples comprises directly estimating the pre-distortion weights from the first and second signal samples.

3. The method of claim 1, wherein calculating the pre-distortion weights from the first and second signal samples comprises:
estimating device distortion parameters for a device distortion model from the first and second signal samples, wherein the first signal samples are the input to the device distortion model and the second signal samples are the output of the device distortion model and wherein the device distortion model reflects distortion introduced by the non-linear electronic device; and
calculating the pre-distortion weights from the device distortion parameters.

4. The method of claim 1, further comprising selecting the at least one multi-unit delay interval of the lattice-predictor memory model structure from a plurality of candidate multi-unit intervals, based on the ratio of the sampling rate of the first and second sample streams to a nominal baseband bandwidth of the input signal.

5. The method of claim 1, wherein the lattice-predictor memory model structure has a uniform multi-unit delay interval between each pair of adjacent delays.

6. The method of claim 5, further comprising selecting the uniform multi-unit delay interval from a plurality of candidate multi-unit intervals, based on the ratio of the sampling rate of the first and second sample streams to a nominal baseband bandwidth of the input signal.

7. The method of claim 1, wherein the electronic device comprises a power amplifier in a wireless transmitter circuit.

8. A pre-distortion circuit for pre-distorting an input signal to compensate for distortion introduced by an electronic device operating on the input signal to produce an output signal, the pre-distortion circuit comprising:
a sampling subcircuit configured to collect, for each of a plurality of sampling time instances, first and second signal samples representing said input and output signals, respectively, wherein said first and second signal samples are spaced at unit-delay intervals and wherein each of the second signal samples corresponds in time to one of the first signal samples;
a pre-distortion modeling circuit configured to calculate pre-distortion weights from the first and second signal samples, wherein the pre-distortion weights correspond to a pre-distortion model comprising a lattice-predictor memory model structure having multiple delays and having at least one multi-unit delay interval between adjacent delays; and
a pre-distortion circuit configured to apply the pre-distortion weights to the input signal, to produce a pre-distorted input signal for input to the electronic device.

9. The pre-distortion circuit of claim 8, wherein the second signal samples are an input to the pre-distortion model and the first signal samples are the output of the pre-distortion model, and wherein calculating the pre-distortion weights from the first and second signal samples comprises directly estimating the pre-distortion weights from the first and second signal samples.

10. The pre-distortion circuit of claim 8, wherein calculating the pre-distortion weights from the first and second signal samples comprises:
estimating device distortion parameters for a device distortion model from the first and second signal samples, wherein the first signal samples are the input to the device distortion model and the second signal samples are the output of the device distortion model and wherein the device distortion model reflects distortion introduced by the non-linear electronic device; and
calculating the pre-distortion weights from the device distortion parameters.

11. The pre-distortion circuit of claim 8, further comprising selecting the at least one multi-unit delay interval of the lattice-predictor memory model structure from a plurality of candidate multi-unit intervals, based on the ratio of the sampling rate of the first and second sample streams to a nominal baseband bandwidth of the input signal.

12. The pre-distortion circuit of claim 8, wherein the lattice-predictor memory model structure has a uniform multi-unit delay interval between each pair of adjacent delays.

13. The pre-distortion circuit of claim 12, further comprising selecting the uniform multi-unit delay interval from a plurality of candidate multi-unit intervals, based on the ratio of the sampling rate of the first and second sample streams to a nominal baseband bandwidth of the input signal.

14. The pre-distortion circuit of claim 8, wherein the electronic device comprises a power amplifier in a wireless transmitter circuit.

* * * * *